(12) United States Patent
Weng et al.

(10) Patent No.: US 9,553,593 B1
(45) Date of Patent: Jan. 24, 2017

(54) DELAY LOCKED LOOP AND ASSOCIATED CONTROL METHOD

(71) Applicant: MStar Semiconductor, Inc., Hsinchu Hsien (TW)

(72) Inventors: Meng-Tse Weng, Zhubei (TW); Hsian-Feng Liu, Zhubei (TW); Chieh-Wen Lee, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/956,554

(22) Filed: Dec. 2, 2015

(30) Foreign Application Priority Data

Aug. 6, 2015 (TW) .............................. 104125591 A

(51) Int. Cl.
*H03L 7/06* (2006.01)
*H03L 7/08* (2006.01)
*H03K 5/14* (2014.01)
*H03K 5/00* (2006.01)

(52) U.S. Cl.
CPC ............. *H03L 7/0805* (2013.01); *H03K 5/14* (2013.01); *H03K 2005/00019* (2013.01)

(58) Field of Classification Search
USPC .................................. 327/147–149, 156–158
See application file for complete search history.

(56) References Cited

U.S. PATENT DOCUMENTS

| 7,728,754 B2 | 6/2010 | Gerfers et al. | |
|---|---|---|---|
| 2014/0327477 A1* | 11/2014 | Chiang | H03L 7/08 327/156 |
| 2015/0102844 A1* | 4/2015 | Ma | H03L 7/0818 327/158 |
| 2015/0372682 A1* | 12/2015 | Alexeyev | H03L 7/085 327/156 |
| 2016/0182065 A1* | 6/2016 | Wicpalek | H03L 7/099 327/156 |

OTHER PUBLICATIONS

TIPO Office Action, May 24, 2016, 6 pages.
Farjad-Rad et al., "A Low-Power Multiplying DDL for Low-Jitter Multigigahertz Clock Generation in Highly Integrated Digital Chips", IEEE Journal of Solid-State Circuits, vol. 37, No. 12, Dec. 2002, pp. 1804-1812.

* cited by examiner

*Primary Examiner* — Adam Houston
(74) *Attorney, Agent, or Firm* — Edell, Shapiro & Finnan, LLC

(57) ABSTRACT

A control method for a delay locked loop includes: delaying an input signal to generate an internal signal; delaying the internal signal to generate an output signal; and selectively providing a reference clock signal or the output signal as the input signal according to the output signal and the internal signal.

20 Claims, 4 Drawing Sheets

DELAY LOCKED LOOP AND ASSOCIATED CONTROL METHOD

This application claims the benefit of Taiwan application Serial No. 104125591, filed Aug. 6, 2015, the subject matter of which is incorporated herein by reference.

BACKGROUND OF THE INVENTION

Field of the Invention

The invention relates in general to a delay locked loop, and more particularly to a multiplying delay locked loop.

Description of the Related Art

A timing device is commonly applied in electronic devices and systems to generate a clock and to allow various elements to operate synchronously. A multiplying delay locked loop (MDLL) is one of the above conventional timing device, as exemplified by an MDLL 100 in FIG. 1. FIG. 2 shows a timing diagram of signals in the MDLL 100. In the MDLL 100, every rising edge of a reference clock signal rclk enters a delay line via a multiplexer 110. After a rising edge of the reference clock signal rclk enters the delay line 108 via the multiplexer 110, a selection signal sel switches to select an output signal bclk of the delay line 108 as an input signal iclk of the delay line 108. At this point, a ring oscillator is formed. The ring oscillator generates clock signals having a period T. After (M−1) clock signal periods, an integer divider 106 (e.g., having a divisor M equal to 8 in the example in FIG. 2) generates a last signal last, in which a pulse represents a last period (the $M^{th}$ period) of the output signal bclk. The last signal last may be regarded as an indication signal that indicates the time point at which the $M^{th}$ clock period appears. After the rising edge of the last signal last, a logic circuit 104 causes the selection signal sel to generate a pulse to control the multiplexer 110, allowing the next rising edge of the reference clock signal rclk to enter and serve as the input signal iclk of the delay line 108. Meanwhile, the delay adjuster 102 compares this rising edge with the rising edge of the output signal bclk to determine a phase difference dt between the two, and generates a control voltage $V_{CNTL}$ to adjust the delay time from the input signal iclk to the output signal bclk in the delay line 108. The goal of the entire circuit operation is to render the phase difference dt to be approximately 0 to lock the phase. When the phase is locked, a clock period of each reference clock signal rclk is equal to M clock periods of the output signal bclk, and the $M^{th}$ rising edge of the output signal bclk is approximately aligned with or appears at about the same time as one rising edge of the reference clock signal rclk.

The MDLL 100 provides numerous advantages. For example, each time the rising edge of the reference clock signal rclk appears, the MDLL 100 may reset the phase difference dt between the output signal bclk and the reference clock signal rclk to zero. Thus, the MDLL 100 prevents an effect of accumulated phase difference generated by a phase locked loop that commonly serves as a timing device. Further, as only one single delay line 108 is utilized to generate the output signal bclk, issues of device mismatch caused by process factors in the delay line 108 do not affect the waveform of the output signal bclk. Moreover, the divisor M in the integer divider 106 may be configurable to generate various output signal bclk having different ratios to the clock period of the reference clock signal rclk.

However, the MDLL 100 suffers from certain issues, and needs to be carefully designed. For example, in general, the reference clock signal rclk needs to be extremely clean and cannot tolerate any drastic jitter, or else the jitter may be directly reflected upon the output signal bclk. Further, with a small design mistake, the jitter in the reference clock signal rclk may lead to disturbances in the MDLL 100 to incur wrongful results.

SUMMARY OF THE INVENTION

Embodiments of the present invention are capable of preventing jitter of a reference clock signal from disturbing a multiplying delay locked loop (MDLL).

A delay locked loop is provided according to an embodiment of the present invention. The delay locked loop includes a programmable delay line, a control logic, a selection circuit, and a mask. The programmable delay line receives an input signal, and generates a first internal signal and an output signal. The output signal and the internal signal have different phases. The control logic receives the output signal and accordingly provides a selection signal. The selection circuit, coupled to the control logic, selectively provides a reference clock signal or the output signal as the input signal. The mask, coupled to the selection circuit, the control logic and the delay line, is controlled by the first internal signal and the selection signal to determine whether to utilize the reference clock signal as the input signal.

A control method is provided according to another embodiment of the present invention. The control method, applied to a delay locked loop, includes: delaying an input signal to generate an input signal; delaying the internal signal to generate an output signal; selectively providing a reference clock signal or the output signal as the input signal; and selectively utilizing the reference clock signal as the input signal according to the output signal and the internal signal.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 3:
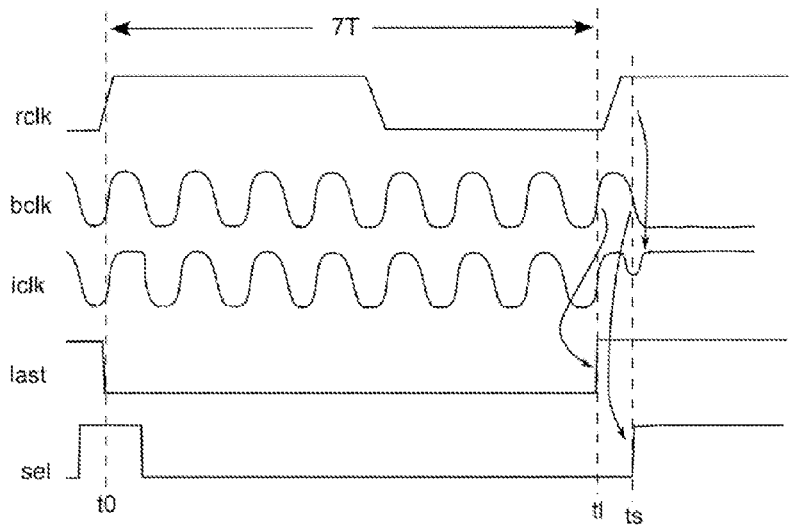
FIG. 3 is another timing diagram of signals in the MDLL in FIG. 1.

FIG. 3 shows another timing diagram of signals in the MDLL 100 for explaining possible issues in the MDLL 100 when the frequency of the reference clock signal rclk jitters drastically.

As shown in FIG. 3, at a time point t0, the phase is substantially locked as a rising edge of the reference clock signal rclk and a rising edge of the output signal bclk appear approximately at the same time. However, due to the jitter in the reference clock signal rclk, a next rising edge of the reference clock signal rclk appears ahead of time, and is even earlier than a time point is at which the pulse of the selection signal sel starts to appear.

In FIG. 3, just as the rising edge of the last signal last appears (at a time point tl), the multiplexer 110 still utilizes the output signal bclk as the input signal iclk, and so the input signal iclk has substantially the same waveform as the output signal bclk. At the time point ts, being triggered by the falling edge of the output signal bclk, the selection signal sel is caused to have a rising edge. Thus, the input signal iclk deviates from the falling trend of the output signal bclk, and starts to rise as being affected by the reference clock signal rclk, incurring a recessed glitch of the output signal iclk at the time point ts. This glitch having an extremely short period is not reflected in a delayed and inversed manner in the output signal bclk via the delay line 108, and so the output signal bclk is kept at a low voltage level.

Figure 1:
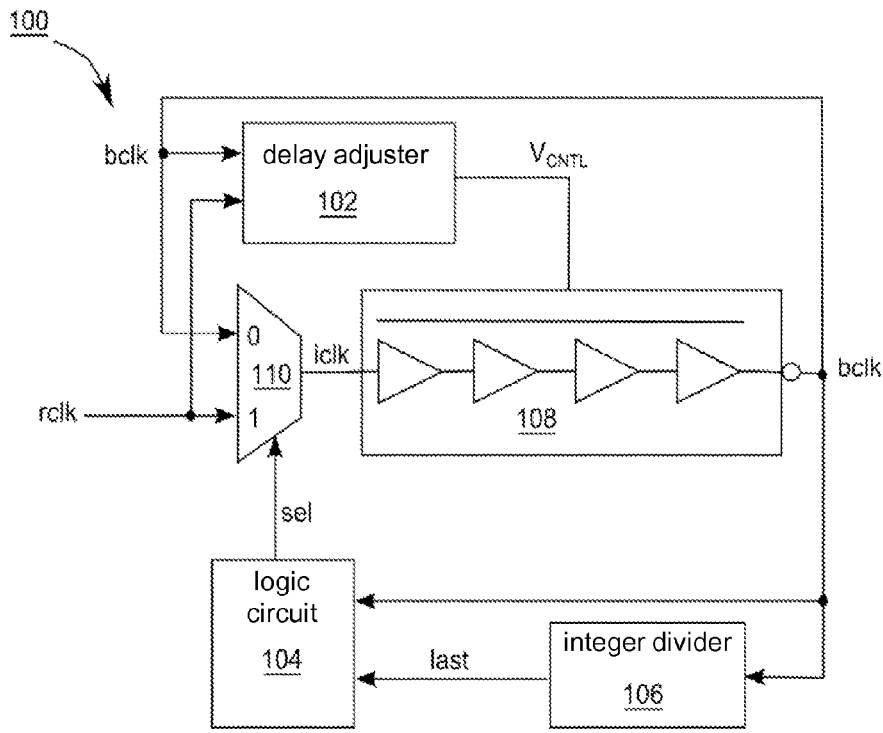
FIG. 1 shows a conventional MDLL.
Figure 2:
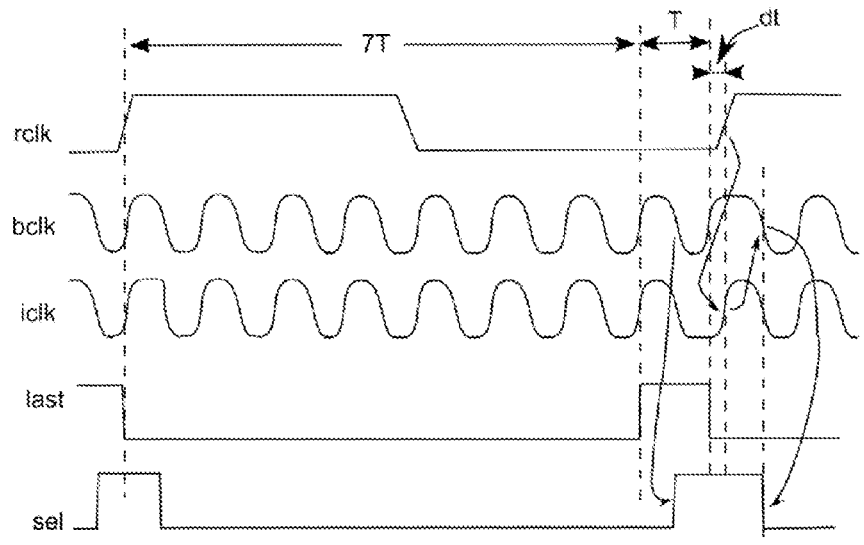
FIG. 2 is a timing diagram of signals in the MDLL in FIG. 1.

In FIGS. 1 and 2, the rising edge and the falling edge of the selection signal sel are triggered by two corresponding falling edges of the output signal bclk. As shown in FIG. 3, the falling edge of the output signal bclk does not appear after the time point ts, and so the falling edge of the selection signal sel does not appear, either. As a result, the entire MDLL 100 is disturbed, and the operation status of the ring oscillator is restored only when the next rising edge of the reference clock signal rclk appears.

In the application, an aperture period is defined as a period that utilizes the reference clock signal rclk as the input signal. In the MDLL 100 in FIG. 1, the aperture period is solely determined by the selection signal sel, and is a period in which the selection signal sel is at logic "1".

The present invention is capable of improving the possible effect that the jitter in the reference clock signal rclk causes on an MDLL.

In some embodiments of the present invention, the aperture period is generated with the consideration of the selection signal sel and at least one internal signal of a delay line instead of solely according to the selection signal sel.

According to an embodiment of the present invention, an MDLL includes a mask that prohibits or permits a reference clock signal to arrive at a multiplexer according to at least one internal signal of a delay line. According to another embodiment of the present invention, an MDLL includes a mask that generates a passing signal according to at least one internal signal of a delay line to control a multiplexer. The multiplexer selects one of a reference and an output signal to serve as an input signal of the delay line.

The passing signal may be regarded as a control signal, and affects or controls a multiplexer in one embodiment.

Figure 4:
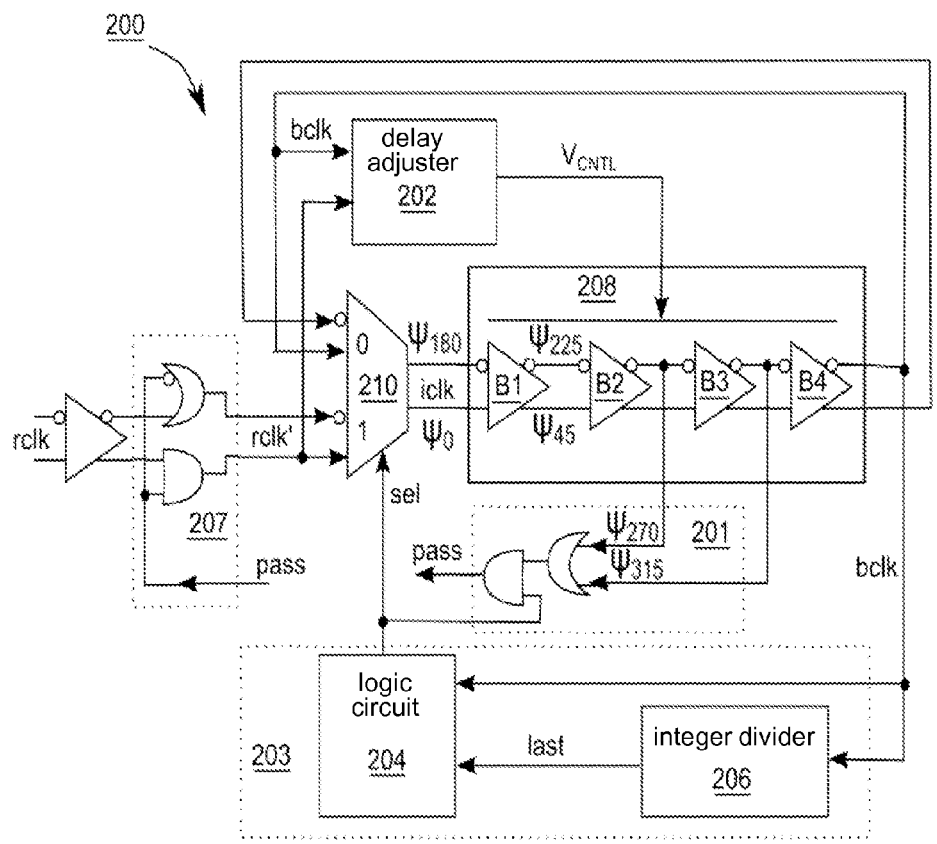
FIG. 4 is an MDLL according to an embodiment of the present invention.

FIG. 4 shows an MDLL 200 according to an embodiment of the present invention. The MDLL 200 includes a delay adjuster 202, a differential delay line 208, a control logic 203, a time control circuit 201, a masking circuit 207 and a multiplexer 210.

Numerous elements of the MDLL 200 are identical or similar to the corresponding elements of the MDLL 100, and related operations, architecture or configuration can be known according to the associated description previously given. Such repeated details are omitted herein.

The multiplexer 210 and the masking circuit 207 are connected in series between the reference clock signal rclk and the input signal iclk. In order to utilize the reference clock signal rclk as the input signal iclk, the multiplexer 210 and the masking circuit 207 need to permit the reference clock signal rclk to pass through. In other words, the aperture period of the MDLL 200 is determined by the multiplexer 210 and the masking circuit 207.

The masking circuit 207 is utilized for prohibiting or permitting the reference clock signal rclk to arrive at the multiplexer 210. When the passing signal pass is enabled, the reference clock signal rclk may pass through the masking circuit 207 to become a reference clock signal rclk'. When the passing signal is disabled, the masking circuit 207 prohibits the reference signal rclk from passing through, and the logic value of the reference clock signal rclk' is kept constant at "0".

The multiplexer 210 is a selection circuit and is controlled by the selection signal sel. The multiplexer 210 selectively provides the reference clock signal rclk' or the output signal bclk to serve as the input signal iclk.

The differential delay line 208 is a programmable delay line having four stages, and includes four differential delay elements B1, B2, B3 and B4 connected in series. An inverting output end of the differential delay element B4 provides the output signal bclk. In the differential delay line 208, the signal delay period of each differential delay element is controlled by the control voltage $V_{CNTL}$. In other words, the control voltage $V_{CNTL}$ determines the signal delay period from the input signal iclk to the output signal bclk in the delay line 208.

The delay adjuster 202 includes a phase detector and a charge pump. The delay adjuster 202 detects the phase difference between the reference clock signal rclk' and the output signal bclk when the multiplexer 210 selects the reference clock signal rclk' as the input signal iclk, and accordingly controls the control voltage $V_{CNTL}$ to adjust the signal delay period from the input signal iclk to the output signal bclk in the delay line 208.

When the output signal bclk is utilized as the input signal iclk, the differential delay line 208 becomes a ring oscillator that provides the output signal bclk as a clock signal. At this point, nodes among the differential delay elements provide internal signals in different phases. As indicated in the example in FIG. 4, two input ends of the differential delay element B1 may respectively provide internal signals $\psi_0$ and $\psi_{180}$ respectively having phases in 0 degree and 180 degrees, and two output ends may respectively provide internal signals $\psi_{45}$ and $\psi_{225}$ respectively having phases in 45 degrees and 225 degrees. The input signal iclk is equal to the internal signal $\psi_0$.

The integer divider 206, coupled to the differential delay line 208, receives the output signal bclk, and detects the number of times the rising edge of the output signal bclk appears. In the description below, 8 is taken as the divisor M of the integer divider 206 as an example. When the $8^{th}$ rising edge of the output signal bclk appears, the divider 206 causes the last signal last to generate a pulse to indicate that the $8^{th}$ clock period (the last clock period) of the output signal bclk has appeared. When the $9^{th}$ rising edge of the output signal bclk appears, it substantially indicates the end of the $8^{th}$ clock period of the output signal bclk, and so the pulse of the last signal last ends.

The logic circuit 204 provides the selection signal sel according to the output signal bclk and the last signal last. When the last signal last indicates the current clock period is the $8^{th}$ clock period, the falling edge of the output signal bclk may trigger the logic circuit 204 to cause the selection signal sel to generate a rising edge and become logic "1", such that the reference clock signal rclk' serves as the input signal iclk. When the selection signal sel is logic "1" and a falling edge of the output signal bclk appears, the logic circuit 204 is triggered to cause the selection signal sel to generate a falling edge, such that the output signal bclk serves as the input signal iclk. The selection signal sel may provide a pulse, which starts from about the falling edge of the $8^{th}$ clock period of the output signal bclk and ends at the falling edge of the $9^{th}$ clock period of the output signal bclk.

The time control circuit 201 generates the passing signal pass according to the internal signals $\psi_{270}$ and $\psi_{315}$ having phases in 270 degrees and 315 degrees as well as the selection signal sel. The phase difference between the internal signals adopted by the time control circuit 201 and the input signal iclk (the internal signal $\psi_0$) may be between 180 degrees and 360 degrees, preferably between 270 degrees and 315 degrees. In FIG. 4, an AND operation is performed on an OR operation result of the internal signals $\psi_{270}$ and $\psi_{315}$ and the selection signal sel to generate the passing signal pass. The time control circuit 201 in FIG. 4 is merely an example. In other embodiments, instead of according to two internal signals, the time control circuit 201 may need only one internal signal. For example, according to another embodiment, the time control circuit may be generated according to an AND operation of the internal signal $\psi_{315}$ and the selection signal sel.

In simple, the glitch generated at the time point is in FIG. 3 is a result of the rising edge of the reference clock signal rclk in FIG. 1 entering the delay line 108 too early. Thus, the time control circuit 201 and the masking circuit 207 together form a mask controlled by the internal signals $\psi_{270}$ and $\psi_{315}$, such that the reference clock signal rclk may serve as the input of the differential delay line 208 only when the rising edge of the selection signal sel appears and the internal signal $\psi_{270}$ or $\psi_{315}$ is at logic "1". In the embodiment, the masking circuit 207 may be regarded as a sub-circuit in the mask.

Figure 5:
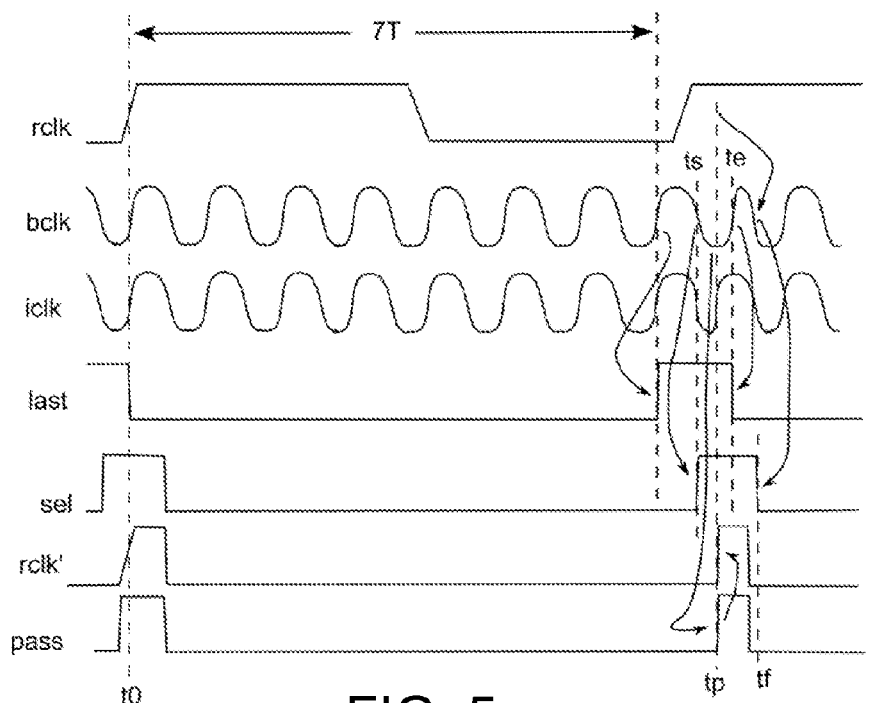
FIG. 5 is a timing diagram of signals of the MDLL in FIG. 4.

FIG. 5 shows a timing diagram of signals in the MDLL 200 in FIG. 4 for explaining why possible issues in the MDLL 100 do not occur in the MDLL 200 when the reference clock signal rclk jitters drastically. For comparison purposes, the reference clock signal rclk in FIG. 5 has the same signal waveform as the reference clock signal rclk in FIG. 3, i.e., having the issue of drastic jittering. Further, same as FIG. 3, the phase is substantially locked at the beginning at the time point t0 in FIG. 5.

At the time point ts, the falling edge of the output signal bclk causes the rising edge of the selection signal sel to appear. However, as the internal signals $\psi_{270}$ and $\psi_{315}$ are still at logic "0" at this point, the passing signal pass is still "0", and the masking circuit 207 causes the reference clock signal rclk' to be kept at "0".

At the time point tp when the output signal bclk is approximately at the valley, the rising edge of the internal signal $\psi_{270}$ appears. At this point, the masking circuit 207 starts permitting the reference clock signal rclk to pass through, and the rising edge of the reference clock signal rclk appears. This rising edge also appears on the input signal iclk via the multiplexer 210, and the aperture period begins.

At the time point te, the rising edge of the output signal bclk appears, and the pulse of the last signal last ends.

At the time point tf, the falling edge of the output signal bclk causes the selection signal to become logic "0", and the pulse of the selection signal sel ends.

At a time point between the time points tf and tp, as the internal signals $\psi_{270}$ and $\psi_{315}$ both change to "0", both of the passing signal pass and the reference clock signal rclk' also change to "0". Thus, the aperture period ends.

While the ring oscillator oscillates, the time point at which the falling edge of the output signal bclk appears is approximately the time point at which the rising edge of the internal signal $\psi_{180}$ appears. It is discovered from FIG. 5 that, the time point at which the rising edge of the reference clock signal rclk enters the differential delay line 208 is no longer determined by the falling edge of the output signal bclk (or the rising edge of the internal signal $\psi_{180}$), and is instead determined by the rising edge of the internal signal $\psi_{270}$ having a further phase delay. Such delay provides the input signal iclk with sufficient time to be pulled down low enough by the differential delay element B4, and a valley that is large enough is then formed between the time points ts and tp in FIG. 5. As such, the MDLL 200 stays functional and does not suffer from the possible issues of the MDLL 100.

Figure 6:
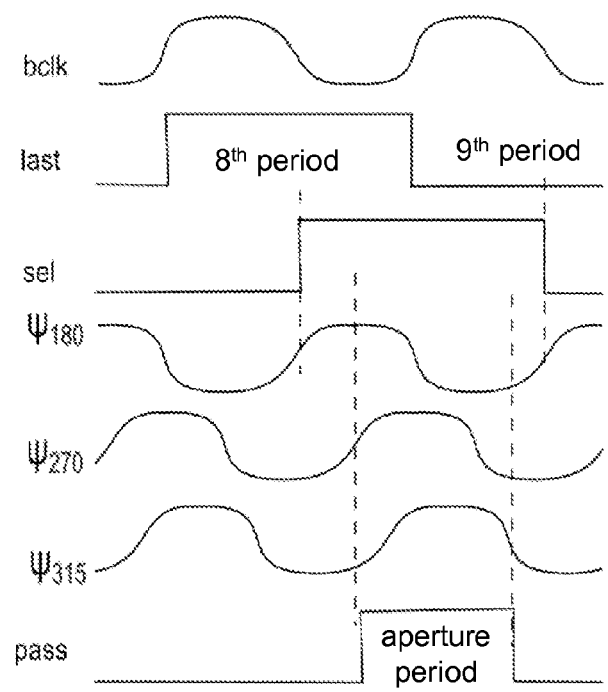
FIG. 6 shows relative positions of a passing signal and a selection signal.

FIG. 6 shows relative positions of two pulses of the passing signal pass and the selection signal sel. The pulse of the selection signal approximately begins from right in the middle of the $8^{th}$ period of the output signal bclk and ends at right in the middle of the $9^{th}$ period, and has a length of approximately equal to one entire clock period of the output signal bclk. The duration of the passing signal pass is limited by the internal signal $\psi_{270}$ or $\psi_{315}$, and is thus shorter and completely falls within the pulse of the selection signal sel. As shown in FIG. 6, the aperture period is approximately a result of an AND operation of the selection signal sel and the passing signal pass, and is thus approximately the period of the passing signal pass in logic "1". Compared to the conventional MDLL 100 in which the aperture period is determined solely according to the selection signal sel, the aperture period of the MDLL 200 in FIG. 200 begins later and ends earlier.

Figure 7:
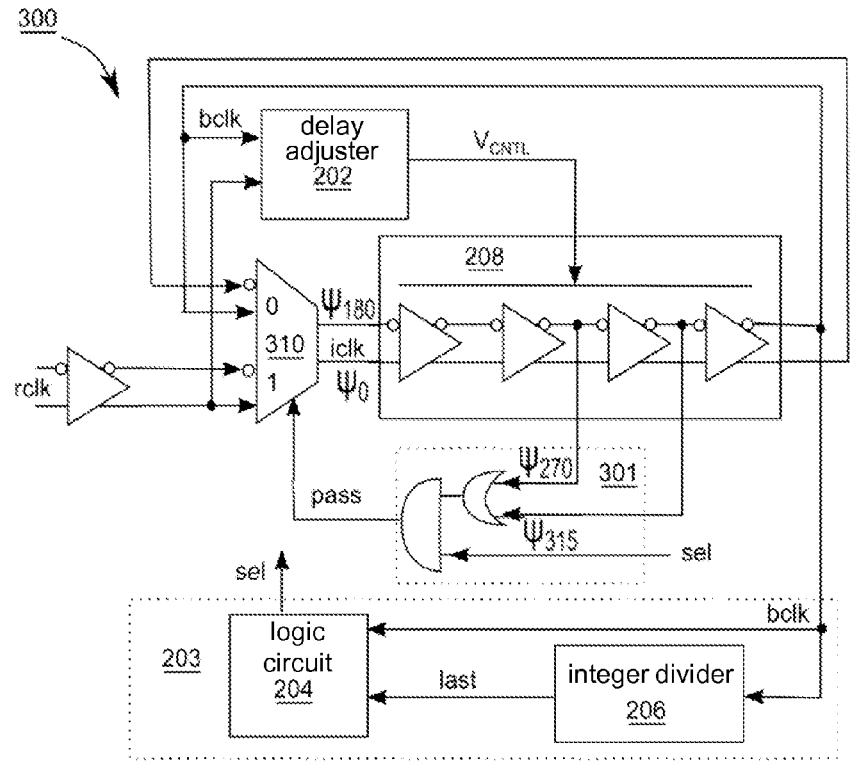
FIG. 7 shows an 300 according to an embodiment of the present invention.

FIG. 7 shows an MDLL 300 according to an embodiment of the present invention. The MDLL 300 includes a delay adjuster 202, a differential delay line 208, a control logic 203, a time control circuit 301 and a multiplexer 310. The time control circuit 301 serves as a mask, and generates the passing signal pass according to the internal signals $\psi_{270}$ and $\psi_{315}$ as well as the selection signal sel. Numerous elements of the MLDD 300 are identical or similar to the corresponding elements of the MDLL 200, and related operations, architecture or configuration can be known from the associated description previously given. Such repeated details are omitted herein.

The multiplexer 210 in FIG. 4 is controlled by the selection signal sel, whereas the multiplexer 310 in FIG. 7 is controlled by the passing signal pass that the time control circuit 301 generates. The internal structure of the time control circuit 301 is identical or similar to the time control circuit 201, and related operations and variations can be known from the associated description previously given. Such repeated details are omitted herein. It is apparent that, in FIG. 7, the aperture period of the MDLL 300 is determined by the passing signal pass, and the passing signal pass is determined according to the internal signals $\psi_{270}$ and $\psi_{315}$ and the selection signal sel.

Figure 8:
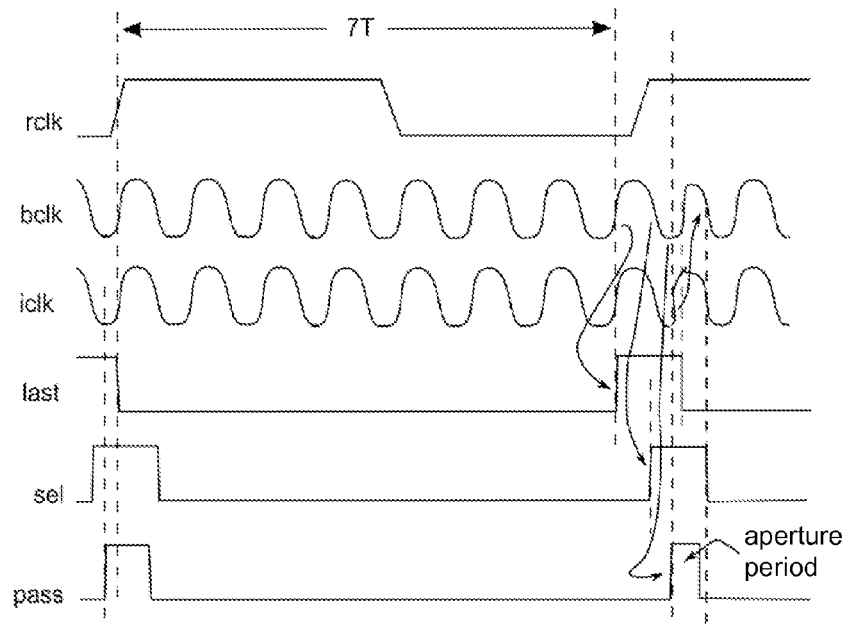
FIG. 8 is a timing diagram of signals of the MDLL in FIG. 7.

FIG. 8 shows a timing diagram of signals in the MDLL 300 in FIG. 7 for explaining why possible issues in the MDLL 100 do not occur in the MDLL 300 when the reference clock signal rclk jitters drastically. Details of FIG. 8 can be referred from the description associated with FIG. 5 and FIG. 6 as well as the MDLL 300 in FIG. 7, and shall be omitted herein. As shown in FIG. 8, the aperture period is the period of the passing signal pass in logic "1". Compared to the conventional MDLL 100 in which the aperture period is determined solely according to the selection signal sel, the aperture period of the MDLL 300 in FIG.

7 begins later and ends earlier, and so the issues of the MDLL 100 in FIG. 3 can be eliminated.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A delay locked loop, comprising:
   a programmable delay line, receiving an input signal to generate a first internal signal and an output signal, the output signal and the first internal signal having different phases;
   a control logic, receiving the output signal and accordingly providing a selection signal;
   a selection circuit, coupled to the control logic, selectively providing a reference clock signal or the output signal as the input signal; and
   a mask, coupled to the selection circuit, the control logic and the delay line, controlled by the first internal signal and the selection signal to determine whether to utilize the reference clock signal as the input signal.

2. The delay locked loop according to claim 1, wherein the mask comprises a time controller, which generates a control signal according to the first internal signal and the selection signal.

3. The delay locked loop according to claim 2, wherein the selection signal selectively provides the reference clock signal or the output signal as the input signal according to the control signal.

4. The delay locked loop according to claim 2, wherein the mask further comprises a sub-circuit, which selectively provides the reference clock signal to the selection circuit.

5. The delay locked loop according to claim 1, wherein when the selection circuit provides the output signal as the input signal, the delay line forms a ring oscillator, and a phase difference between the first internal signal and the output signal is substantially between 180 degrees and 360 degrees.

6. The delay locked loop according to claim 5, wherein the phase difference is substantially between 270 degrees and 315 degrees.

7. The delay locked loop according to claim 1, wherein the programmable delay line further generates a second internal signal; the first internal signal, the second internal signal and the output signal have different phases; and the mask determines whether to utilize the reference clock signal as the input signal according to the first internal signal, the second internal signal and the selection signal.

8. The delay locked loop according to claim 7, wherein when the selection circuit selects the output signal as the input signal, the delay line forms a ring oscillator, and a first phase difference between the first internal signal and the input signal and a second phase difference between the second internal signal and the input signal are substantially between 270 degrees and 315 degrees.

9. The delay locked loop according to claim 1, wherein the control logic provides the selection signal according to a falling edge of the output signal.

10. The delay locked loop according to claim 9, wherein the control logic comprises a divider, which provides an indication signal according to the output signal to indicate a last clock period, and the selection signal is generated according to the falling edge and the indication signal.

11. The delay locked loop according to claim 10, wherein the selection signal provides a pulse, which is triggered by the falling edge and ends at a next falling edge of the output signal.

12. A control method, applied to a delay locked loop, comprising:
    delaying an input signal to generate an internal signal;
    delaying the internal signal to generate an output signal; and
    selectively providing a reference clock signal or the output signal as the input signal according to the output signal and the internal signal.

13. The method according to claim 12, wherein the step of selectively utilizing the reference clock signal as the input signal comprises:
    providing a selection signal according to the output signal to control a selection circuit to selectively provide the reference clock signal or the output signal as the input signal; and
    generating a control signal according to the selection signal and the internal signal to selectively input the reference clock signal to the selection circuit.

14. The method according to claim 12, wherein the step of selectively utilizing the reference clock signal as the input signal comprises:
    providing a control signal according to the selection signal and the internal signal to control a selection circuit to selectively provide the reference clock signal or the output signal as the input signal.

15. The method according to claim 12, wherein the internal signal is a first internal signal, the method further comprising:
    delaying the first internal signal to generate a second internal signal; and
    delaying the second internal signal to generate the output signal;
    wherein, the reference clock signal is selectively utilized as the input signal according to the output signal, the first internal signal and the second internal signal.

16. The method according to claim 15, wherein when the output signal is utilized as the input signal, a phase of the output signal is substantially 0 degree, and phases of the first and second internal signals are substantially between 180 degrees and 360 degrees.

17. The method according to claim 16, further comprising:
    selectively utilizing the reference clock signal as the input signal according to an OR operation result of the first and second internal signals.

18. The method according to claim 12, wherein the step of selectively utilizing the reference clock signal as the input signal comprises:
    performing an integer division on the output signal to generate an indication signal to indicate a beginning and an end of a last period of the output signal.

19. The method according to claim 18, further comprising:
    generating a selection signal according to the indication signal and the output signal, the selection signal providing a pulse that begins at a falling edge of the output signal and ends at a next falling edge of the output signal.

20. The method according to claim 19, further comprising:

providing a control signal according to the selection signal and the internal signal to selectively utilize the reference clock signal as the input signal.

* * * * *